US012757655B2

(12) United States Patent
Lee et al.

(10) Patent No.: US 12,757,655 B2
(45) Date of Patent: Oct. 6, 2026

(54) METHOD OF FORMING THIN FILM

(71) Applicant: SOULBRAIN CO., LTD., Gyeonggi-do (KR)

(72) Inventors: Seung Hyun Lee, Gyeonggi-do (KR); Jae Sun Jung, Gyeonggi-do (KR); Chang Bong Yeon, Gyeonggi-do (KR); Deok Hyun Kim, Gyeonggi-do (KR)

(73) Assignee: SOULBRAIN CO., LTD., Gyeonggi-do (KR)

( * ) Notice: Subject to any disclaimer, the term of this patent is extended or adjusted under 35 U.S.C. 154(b) by 35 days.

(21) Appl. No.: 18/848,153

(22) PCT Filed: Mar. 17, 2023

(86) PCT No.: PCT/KR2023/003580
§ 371 (c)(1),
(2) Date: Sep. 18, 2024

(87) PCT Pub. No.: WO2023/195656
PCT Pub. Date: Oct. 12, 2023

(65) Prior Publication Data
US 2025/0191911 A1 Jun. 12, 2025

(30) Foreign Application Priority Data
Apr. 5, 2022 (KR) ........................ 10-2022-0042351
Oct. 27, 2022 (KR) ........................ 10-2022-0140240

(51) Int. Cl.
*H10P 14/60* (2026.01)

(52) U.S. Cl.
CPC ...... *H10P 14/6512* (2026.01); *H10P 14/6339* (2026.01)

(58) Field of Classification Search
CPC ............. H10P 14/6512; H10P 14/6339; C23C 16/0272; C23C 16/45525
See application file for complete search history.

(56) References Cited

U.S. PATENT DOCUMENTS 6,623,799 B1 9/2003 Lee et al.
6,806,289 B1 * 10/2004 Lippard .............. C07F 15/0093 514/492

(Continued)

FOREIGN PATENT DOCUMENTS

JP 2002525427 A 8/2002
JP 2010138426 A 6/2010

(Continued)

OTHER PUBLICATIONS

Eom, Taeyong, et al., "Combined Ligand Exchange and Substitution Reactions in Atomic Layer Deposition of Conformal Ge2Sb2Te5 Film for Phase Change Memory Application". Chemistry of Materials, 2015, 27, 3707-3713.*

(Continued)

*Primary Examiner* — Bret P Chen
(74) *Attorney, Agent, or Firm* — SZDC Law PC

(57) ABSTRACT

Disclosed is a method of forming a thin film, a semiconductor substrate fabricated using the method, and a semiconductor device including the semiconductor substrate. By effectively replacing the ligand of an adsorption precursor by using a reaction surface pretreatment agent and a ligand substitution agent in combination, the reaction speed may be improved and the thin film growth rate may be appropriately reduced. In addition, even when forming a thin film on a substrate with a complex structure, step coverage and the thickness uniformity of a thin film may be greatly improved, impurities may be reduced, and film quality may be improved.

10 Claims, 2 Drawing Sheets

(56) References Cited

U.S. PATENT DOCUMENTS

| | | | | |
|---|---|---|---|---|
| 10,290,833 | B2 * | 5/2019 | Helander | H01B 1/00 |
| 2006/0286776 | A1 | 12/2006 | Ranish et al. | |
| 2008/0248648 | A1 * | 10/2008 | Thompson | H01L 21/28556 438/681 |
| 2016/0045841 | A1 * | 2/2016 | Kaplan | B01D 3/06 429/49 |
| 2017/0062205 | A1 | 3/2017 | Chang et al. | |
| 2017/0068162 | A1 * | 3/2017 | Kasahara | G03F 7/0002 |
| 2017/0211183 | A1 | 7/2017 | Moon et al. | |
| 2017/0342559 | A1 * | 11/2017 | Fukazawa | C23C 16/45531 |
| 2018/0342391 | A1 | 11/2018 | Park et al. | |
| 2021/0166948 | A1 | 6/2021 | Degai et al. | |
| 2021/0214842 | A1 | 7/2021 | Yoon et al. | |
| 2022/0017455 | A1 | 1/2022 | Okawa et al. | |
| 2022/0194969 | A1 * | 6/2022 | Lee | C08L 65/00 |
| 2023/0263042 | A1 * | 8/2023 | Cho | C09K 11/025 252/301.4 R |
| 2025/0223697 | A1 * | 7/2025 | Lee | C23C 16/45534 |

FOREIGN PATENT DOCUMENTS

| | | | |
|---|---|---|---|
| JP | 2021031766 | A | 3/2021 |
| JP | 2022017896 | A | 1/2022 |
| JP | 2023509959 | A | 3/2023 |
| JP | 2023532104 | A | 7/2023 |
| KR | 20000022014 | A | 4/2000 |
| KR | 20170016748 | A | 2/2017 |
| KR | 20190140104 | A | 12/2019 |
| KR | 102199999 | B1 | 1/2021 |
| KR | 10-2021-0059332 | A | 5/2021 |
| KR | 20210059332 | A | 5/2021 |
| KR | 20220009838 | A | 1/2022 |
| TW | 202133335 | A | 9/2021 |

OTHER PUBLICATIONS

Clough, Thomas J., et al., "Ligand design strategies to increase stability of gadolinium-based magnetic resonance imaging contrast agents". Nature Communications (2019) 10:1420, pp. 1-14.*

Samanta, Avradeep, et al., "Ligand substitution reaction on a platinum(II) complex with bio-relevant thiols: kinetics, mechanism and bioactivity in aqueous medium". RSC Adv., 2014, 4, 43516, pp. 1-9.*

* cited by examiner

[FIG. 1]
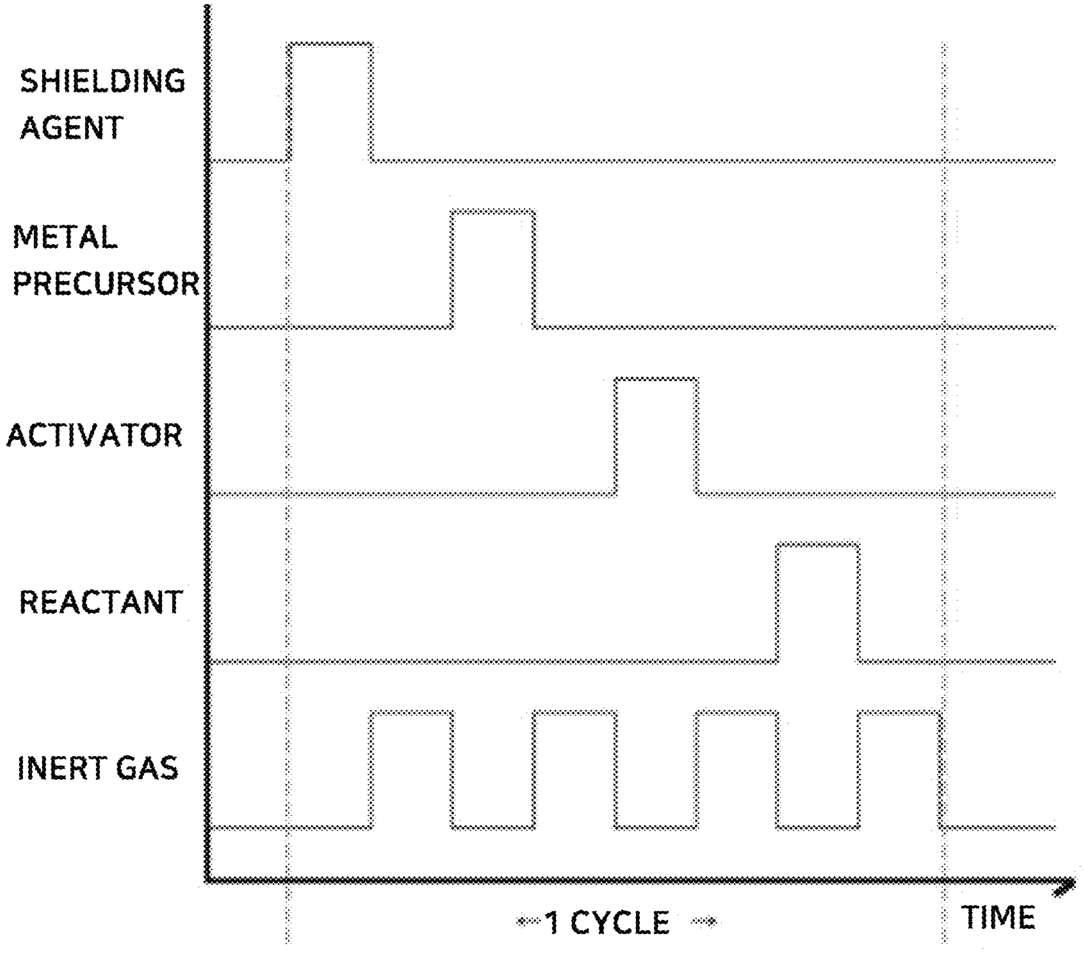

[FIG. 2]
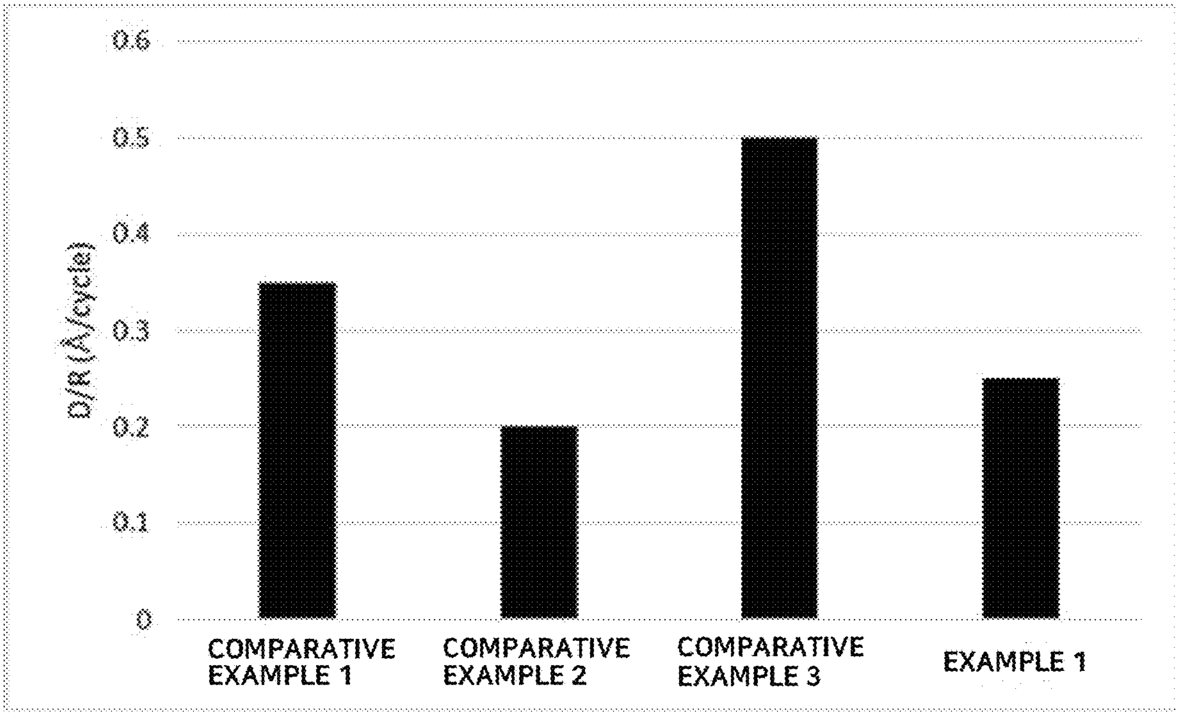

METHOD OF FORMING THIN FILM

This application is the National Stage Application of PCT/KR2023/003580, filed on Mar. 17, 2023, which claims priority to Republic of Korea Patent Application Nos. KR 10-2022-0042351, filed on Apr. 5, 2022, and KR 10-2022-0140240, filed on Oct. 27, 2022, all of which are incorporated by reference for all purposes as if fully set forth herein.

TECHNICAL FIELD

The present invention relates to a method of forming a thin film, a semiconductor substrate fabricated using the method, and a semiconductor device including the semiconductor substrate. More particularly, according to the present invention, by sequentially applying a reaction surface pretreatment agent, a ligand substitution agent, and a precursor compound, by simultaneously providing the gradation adsorption effect on a reaction surface by the reaction surface pretreatment agent and the film quality improvement effect by the ligand substitution agent, even when forming a thin film on a substrate with a complex structure, step coverage and the thickness uniformity of a thin film may be improved, impurities may be greatly reduced, and the film quality may be improved.

Background Art

In the case of thin films formed through the conventional atomic layer deposition (ALD) process, the ligands of a precursor compound injected during a deposition process may not be sufficiently removed and may remain in the growing thin film, which causes a contamination phenomenon in which impurities are introduced into the thin film.

That is, due to the miniaturization of semiconductor devices, when forming a thin film in a horizontal direction, impurities (C, $Cl^-$, $F^-$, etc.) derived from ligands in the thin film may disrupt the crystal arrangement and reduce the density of the formed thin film.

Electrical conductivity may be impaired due to low density. On the other hand, the use of substrates containing deep via holes or trenches is increasing due to miniaturization and lamination of semiconductor devices.

When filling a cylindrical hole pattern or trench or forming a thin film along a vertical inner wall, it is difficult to form a step coverage close to 100%, which uniformly forms the thickness of a thin film formed on the upper portion of a pattern and the thickness of a thin film formed on the lower portion of a trench.

Therefore, it is necessary to develop a method of forming a thin film that allows the formation of a thin film with a complex structure, reduces the residual amount of impurities, and greatly improves step coverage and the thickness uniformity of a thin film; and a semiconductor substrate fabricated using the method.

Related Art Documents

Patent Documents (Patent Document 1) KR 2019-0140104 A

DISCLOSURE

Technical Problem

Therefore, the present invention has been made in view of the above problems, and it is one object of the present invention to provide a method of forming a thin film and a semiconductor substrate fabricated using the method.

According to the method of the present invention, by using a reaction surface pretreatment agent and a ligand substitution agent in combination, a substrate may be effectively shielded and the film quality may be improved at the same time. Thus, the reaction speed may be improved and the thin film growth rate may be appropriately reduced. In addition, even when forming a thin film on a substrate with a complex structure, step coverage and the thickness uniformity of a thin film may be greatly improved, and impurities may be reduced.

It is another object of the present invention to improve step coverage by using a reaction surface pretreatment agent and improve film quality such as electrical properties, dielectric properties, and thin film density by using a ligand substitution agent.

The above and other objects can be accomplished by the present invention described below.

Technical Solution

In accordance with one aspect of the present invention, provided is a method of forming a thin film, the method including:

injecting a reaction surface pretreatment agent into a chamber to shield a surface of a loaded substrate; injecting a precursor compound into the chamber and adsorbing the precursor compound onto the surface of the shielded substrate; injecting a ligand substitution agent into the chamber to perform ligand substitution of the adsorbed precursor compound; and injecting a reaction gas into the chamber to form a thin film.

The reaction surface pretreatment agent may have two or more types of nitrogen (N), oxygen (O), phosphorus (P), and sulfur(S) and may include a linear or cyclic saturated or unsaturated hydrocarbon having 3 to 15 carbon atoms.

The reaction surface pretreatment agent may include a compound having a structure containing nitrogen (N), oxygen (O), phosphorus (P), or sulfur(S) at each terminal of a central carbon atom connected by a double bond to oxygen.

The reaction surface pretreatment agent may include a compound having a structure containing nitrogen (N), oxygen (O), phosphorus (P), or sulfur(S) at one end of a central carbon atom connected by a double bond to oxygen and carbon (C) at the other end.

The reaction surface pretreatment agent may include one or more selected from compounds represented by Chemical Formulas 1 to 4 below.

[Chemical Formula 1]

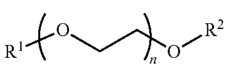

[Chemical Formula 2]

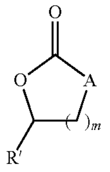

[Chemical Formula 3]

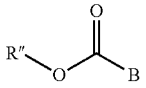

-continued

[Chemical Formula 4]

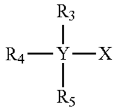

wherein, in Chemical Formulas 1 to 4, R1 and R2 are independently H or an alkyl group having 1 to 5 carbon atoms; R3, R4, and R5 are independently H or -(Me) z-$CH_3$, wherein Me is a saturated or unsaturated hydrocarbon with 1 to 3 carbon atoms, and z is an integer from 0 to 4; R' and R" are independently hydrogen, an alkyl group having 1 to 5 carbon atoms, an alkene group having 1 to 5 carbon atoms, or an alkoxy group having 1 to 5 carbon atoms;

A is oxygen (O), sulfur(S), phosphorus (P), nitrogen (N), —CH, or —$CH_2$;

B is —OH, —$OCH_3$, —$OCH_2CH_3$, —$CH_2CH_3$, —SH, —$SCH_3$, or —$SCH_2CH_3$;

X is fluorine (F), chlorine (Cl), bromine (Br), or iodine (I);

Y is carbon (C) or silicon (Si);

n is an integer from 1 to 4; and m is an integer from 0 to 3.

The reaction surface pretreatment agent may include one or more selected from compounds represented by Chemical Formulas 1-1 to 1-6, Chemical Formulas 2-1 to 2-4, Chemical Formulas 3-1 to 3-4, and Chemical Formulas 4-1 to 4-4 below.

[Chemical Formulas 1-1 to 1-6]

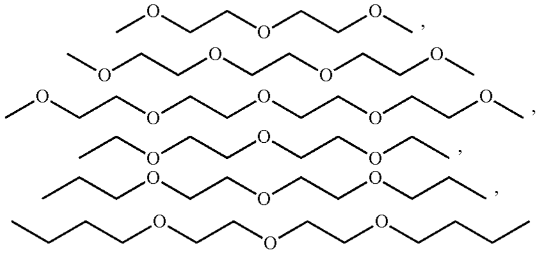

[Chemical Formulas 2-1 to 2-4]

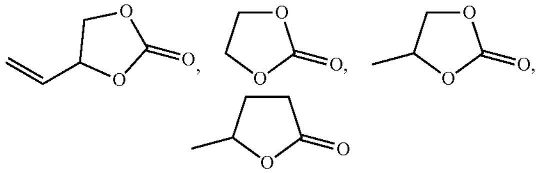

[Chemical Formulas 3-1 to 3-4]

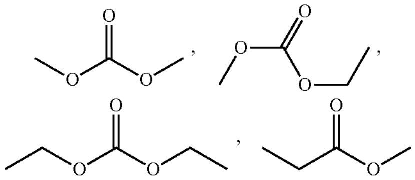

[Chemical Formulas 4-1 to 4-4]

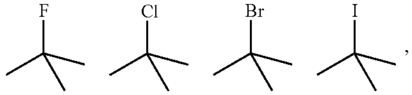

The ligand substitution agent may include one or more selected from hydrogen iodide, hydrogen iodide water, methyl iodide, ethyl iodide, propyl iodide, butyl iodide, isopropyl iodide, and tert-butyl iodide.

The ligand substitution agent may be a 3 N to 15 N hydrogen iodide single substance, a gas mixture containing 1 to 99% by weight of 3 N to 15 N hydrogen iodide and an inert gas filling up to 100% by weight of a total weight, or an aqueous solution mixture containing 0.5 to 70% by weight of 3N to 15N hydrogen iodide and water filling up to 100% by weight of a total weight. Here, the inert gas may be nitrogen, helium, or argon with a purity of 4 N to 9 N.

The ligand substitution agent may have a refractive index of 1.40 or more, 1.42 to 1.50, 1.43 to 1.48, or 1.44 to 1.48.

The reaction surface pretreatment agent and the ligand substitution agent may provide a substitution area for an oxide film, a nitride film, a metal film, or a selective thin film thereof.

The thin film may be a laminated film of one or more selected from the group consisting of Al, Si, Ti, V, Co, Ni, Cu, Zn, Ga, Ge, Se, Zr, Nb, Mo, Ru, Rh, In, Sn, Sb, Te, Hf, Ta, W, Re, Os, Ir, La, Ce, and Nd.

The thin film may be formed on the entire or part of a substrate on which the oxide film, the nitride film, the metal film, or the selective thin film thereof is formed.

The thin film may be used as a diffusion barrier film, an etching stop film, an electrode film, a dielectric film, a gate insulating film, a block oxide film, or a charge trap. When forming the film, step coverage and film quality may be improved.

The precursor compound used in the method of forming a thin film may be a compound represented by Chemical Formula below.

[Chemical Formula 5]

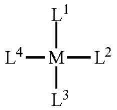

In Chemical Formula 5, M includes one or more selected from Al, Si, Ti, V, Co, Ni, Cu, Zn, Ga, Ge, Se, Zr, Nb, Mo, Ru, Rh, In, Sn, Sb, Te, Hf, Ta, W, Re, Os, Ir, La, Ce, and Nd; and L1, L2, L3, and L4 is-H, —X, —R, —OR, or —$NR_2$, and are the same or different. Here, —X is F, Cl, Br, or I; —R is linear or circular C1-C10 alkyl, C1-C10 alkene, or C1-C10 alkane; and in L1, L2, L3, and L4, the n value of L ranges from 2 to 6, depending on the oxidation number of a central metal.

For example, when the central metal is divalent, L1 and L2 may be attached to the central metal as ligands. When the central metal is hexavalent, L1, L2, L3, L4, L5, and L6 may be attached to the central metal. The ligands corresponding to L1 to L6 may be the same or different.

In Chemical Formula 5, L1, L2, L3, and L4 are —H, or —R, and are the same or different. Here, —R is linear or circular C1-C10 alkyl, C1-C10 alkene, or C1-C10 alkane; and in L1, L2, L3, and L4, the n value of L ranges from 2 to 6, depending on the oxidation number of a central metal.

For example, when the central metal is divalent, L1 and L2 may be attached to the central metal as ligands. When the central metal is hexavalent, L1, L2, L3, L4, L5, and L6 may be attached to the central metal. The ligands corresponding to L1 to L6 may be the same or different.

In Chemical Formula 5, L1, L2, L3, and L4 are —H, —OR, or —$NR_2$, and are the same or different. Here, —R is H, C1-C10 alkyl, C1-C10 alkene, C1-C10 alkane, iPr, or TBu.

In Chemical Formula 5, L1, L2, L3, and L4 are —H or —X, and are be the same or different. Here, —X is F, Cl, Br, or I.

In accordance with another aspect of the present invention, provided is a method of forming a thin film, the method including:

injecting a reaction surface pretreatment agent into a chamber to shield a surface of a loaded substrate; performing 1st purging inside the chamber with a purge gas; injecting a precursor compound into the chamber and adsorbing the precursor compound onto the surface of the shielded substrate; performing 2nd purging inside the chamber with a purge gas; injecting a ligand substitution agent into the chamber to perform ligand substitution of the adsorbed precursor compound; performing 3rd purging inside the chamber with a purge gas; and injecting a reaction gas into the chamber to form a thin film.

The precursor compound may be a molecule composed of one or more selected from the group consisting of Al, Si, Ti, V, Co, Ni, Cu, Zn, Ga, Ge, Se, Zr, Nb, Mo, Ru, Rh, In, Sn, Sb, Te, Hf, Ta, W, Re, Os, Ir, La, Ce, and Nd, and may be a precursor having a vapor pressure of greater than 0.01 mTorr and 100 Torr or less at 25° C.

The chamber may be an ALD chamber, a CVD chamber, a PEALD chamber, or a PECVD chamber.

The reaction surface pretreatment agent, the ligand substitution agent, or the precursor compound may be vaporized, injected, and then subjected to plasma post-treatment.

The amount of purge gas injected into the chamber at each step may be 10 to 100,000 times the volume of the injected reaction surface pretreatment agent, precursor compound, or ligand substitution agent.

The reaction gas may be an oxidizing agent, a nitriding agent, or a reducing agent, and the reaction gas, the reaction surface pretreatment agent, the ligand substitution agent, and the precursor compound may be transferred into the chamber by a VFC, DLI, or LDS method.

The thin film may be a tungsten film, a molybdenum film, a silicon nitride film, a silicon oxide film, a titanium nitride film, a titanium oxide film, a tungsten nitride film, a molybdenum nitride film, a hafnium oxide film, a zirconium oxide film, a tungsten oxide film, or an aluminum oxide film.

The substrate loaded into the chamber may be heated to 100 to 800° C., and the ratio of amount (mg/cycle) of the reaction surface pretreatment agent, the precursor compound, and the ligand substitution agent fed into the chamber may be 1:1 to 1:20:0.5 to 1.0.

In accordance with still another aspect of the present invention, provided is a semiconductor substrate fabricated using the above-described method of forming a thin film.

The thin film may have a multilayer structure of 2 or 3 layers.

In accordance with yet another aspect of the present invention, provided is a semiconductor device including the above-described semiconductor substrate.

The semiconductor substrate may be low resistive metal gate interconnects, a high aspect ratio 3D metal-insulator-metal capacitor, a DRAM trench capacitor, 3D Gate-All-Around (GAA), or a 3D NAND flash memory.

Advantageous Effects

According to the present invention, the present invention has an effect of providing a method of forming a thin film. According to the method of the present invention, by sequentially applying a reaction surface pretreatment agent, a ligand substitution agent, and a precursor compound, the gradation adsorption effect on a reaction surface by the reaction surface pretreatment agent and the film quality improvement effect by the ligand substitution agent can be provided at the same time. Thus, even when forming a thin film on a substrate with a complex structure, step coverage and the thickness uniformity of a thin film can be improved, impurities can be greatly reduced, and the film quality can be improved.

In addition, by effectively reducing process by-products during thin film formation, corrosion and deterioration can be prevented, and the film quality can be improved to improve the crystallinity of a thin film, thereby improving the electrical properties of the thin film.

In addition, the step coverage can be improved by using a reaction surface pretreatment agent and the film quality such as electrical properties, dielectric properties, and thin film density can be improved by using a ligand substitution agent. In addition, the present invention has an effect of providing a method of forming a thin film using the reaction surface pretreatment agent and the ligand substitution agent and a semiconductor substrate fabricated using the method.

DESCRIPTION OF DRAWINGS

FIG. 1 is a schematic diagram showing a deposition process sequence according to the present invention, focusing on one cycle.

FIG. 2 is a graph comparing the deposition rates of thin films in Example 1 according to the present invention and Comparative Examples 1 to 3, which are outside the range of the present invention.

BEST MODE

Hereinafter, a method of forming a thin film according to the present invention and a semiconductor substrate fabricated using the method are described in detail.

In the present disclosure, unless otherwise specified, the term "reaction surface pretreatment agent" refers to a material capable of providing a gradation adsorption effect on a reaction surface by reducing, inhibiting, or blocking the adsorption of a precursor compound for forming a thin film onto a substrate and the adsorption of process by-products onto the substrate.

In the present disclosure, unless otherwise specified, the term "ligand substitution agent" refers to a substance capable of providing a film quality improvement effect by substituting the ligand of a precursor compound.

In the present disclosure, unless otherwise specified, the term "modification" refers to the positive interaction of a substance other than a precursor and reactant on a reaction surface to improve film quality, such as reducing resistivity, increasing density, reducing impurities, and improving step coverage in a deposited thin film.

The present inventors confirmed that, by using a reaction surface pretreatment agent capable of shielding the adsorption of a precursor compound supplied to form a thin film on the surface of a substrate loaded inside a chamber and a ligand substitution agent capable of modifying the film quality of the formed thin film in combination, step coverage was improved by using the reaction surface pretreatment agent, and film quality such as electrical properties, dielectric properties, and thin film density were improved by using the ligand substitution agent. Based on these results, the present inventors conducted further studies on a method of forming a thin film to complete the present invention.

For example, the thin film may be provided with one or more precursors selected from the group consisting of Al, Si, Ti, V, Co, Ni, Cu, Zn, Ga, Ge, Se, Zr, Nb, Mo, Ru, Rh, In, Sn, Sb, Te, Hf, Ta, W, Re, Os, Ir, La, Ce, and Nd, and may provide an oxide film, a nitride film, or a metal film. In this case, the effects desired in the present invention may be sufficiently achieved.

As a specific example, the thin film may have a film composition of a silicon nitride film, a silicon oxide film, a titanium nitride film, a titanium oxide film, a tungsten nitride film, a molybdenum nitride film, a hafnium oxide film, a zirconium oxide film, a tungsten oxide film, or an aluminum oxide film.

The thin film may contain the aforementioned film composition alone or in a selective area, but is not limited thereto, and also includes SiH and SiOH.

In addition to a commonly used diffusion barrier film, the thin film may be used in semiconductor devices as an etching stop film, an electrode film, a dielectric film, a gate insulating film, a block oxide film, or a charge trap.

In the present invention, the precursor compound used in the formation of the thin film is a molecule having Al, Si, Ti, V, Co, Ni, Cu, Zn, Ga, Ge, Se, Zr, Nb, Mo, Ru, Rh, In, Sn, Sb, Te, Hf, Ta, W, Re, Os, Ir, La, Ce, or Nd as a central metal atom (M) and one or more ligands of C, N, O, H, and X (halogen). For a precursor having a vapor pressure of 1 mTorr to 100 Torr at 25° C., the effect of pretreatment with the reaction surface pretreatment agent and the effect of substitution with the ligand substitution agent may be maximized.

For example, as the precursor compound, a compound represented by Chemical Formula 5 below may be used.

[Chemical Formula 5]

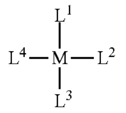

In Chemical Formula 5, M includes one or more selected from Al, Si, Ti, V, Co, Ni, Cu, Zn, Ga, Ge, Se, Zr, Nb, Mo, Ru, Rh, In, Sn, Sb, Te, Hf, Ta, W, Re, Os, Ir, La, Ce, and Nd; and L1, L2, L3, and L4 is-H, —X, —R, —OR, or —$NR_2$, and are the same or different. Here, —X is F, Cl, Br, or I; —R is linear or circular C1-C10 alkyl, C1-C10 alkene, or C1-C10 alkane; and in L1, L2, L3, and L4, the n value of L ranges from 2 to 6, depending on the oxidation number of a central metal.

For example, when the central metal is divalent, L1 and L2 may be attached to the central metal as ligands. When the central metal is hexavalent, L1, L2, L3, L4, L5, and L6 may be attached to the central metal. The ligands corresponding to L1 to L6 may be the same or different.

In Chemical Formula 5, M is hafnium (Hf), silicon (Si), zirconium (Zr), titanium (Ti), or aluminum (Al), preferably hafnium (Hf), titanium (Ti) or silicon (Si). In this case, the effect of reducing process by-products and the effect of improving thin film density may be increased, and step coverage and the electrical properties, insulating properties, and dielectric properties of the thin film may be excellent.

L1, L2, L3, and L4 may be —H, or —R, and may be the same or different. Here, —R may be C1-C10 alkyl, C1-C10 alkene, or C1-C10 alkane, and may have a linear or circular structure. In this case, an appropriate amount of reaction energy may be obtained for substitution by the ligand substitution agent described below.

In addition L1, L2, L3, and L4 may be —H, —OR, or —$NR_2$, and may be the same or different. Here, —R may be H, C1-C10 alkyl, C1-C10 alkene, C1-C10 alkane, iPr, or tBu. In this case, an appropriate amount of reaction energy may be obtained for substitution by the ligand substitution agent described below.

In addition, in Chemical Formula 5, L1, L2, L3, and L4 may be —H or —X, and may be the same or different. Here, —X may be F, Cl, Br, or I. In this case, an appropriate amount of reaction energy may be obtained for substitution by the ligand substitution agent described below.

Specifically, examples of the silicon precursor compound may include one or more selected from $SiH_4$, $SiHCl_3$, $SiH_2Cl_2$, $SiCl_4$, $Si_2Cl_6$, $Si_3Cl_8$, $Si_4Cl_{10}$, $SiH_2[NH(C4H9)]_2$, $Si_2$ $(NHC_2H_5)_4$, $Si_3NH_4$ $(CH_3)_3$, $SiH_3[N(CH_3)_2]$, $SiH_2[N(CH_3)_2]_2$, $SiH[N(CH_3)_2]_3$, and $Si[N(CH_3)_2]_4$. In this case, an appropriate amount of reaction energy may be obtained for substitution by the ligand substitution agent described below.

In addition, examples of the hafnium precursor compound may include tris(dimethylamido)cyclopentadienyl hafnium of CpHf $NMe_2)_3$) and (methyl-3-cyclopentadienylpropylamino)bis(dimethylamino) hafnium of $Cp(CH_2)_3NM_3Hf(NMe_2)_2$. In this case, an appropriate amount of reaction energy may be obtained for substitution by the ligand substitution agent described below.

In addition, examples of the titanium precursor compound may include $TiCl_4$ and $Ti(CpMe_5)(OMe)_3$. In this case, an appropriate amount of reaction energy may be obtained for substitution by the ligand substitution agent described below.

For example, the precursor compound may be mixed with a non-polar solvent and used. In this case, the viscosity or vapor pressure of the precursor compound may be easily controlled.

The reaction surface pretreatment agent has two or more types of nitrogen (N), oxygen (O), phosphorus (P), and sulfur(S), and includes a linear or cyclic saturated or unsaturated hydrocarbon having 3 to 15 carbon atoms. In this case, by forming a shielded area that does not remain in a thin film during thin film formation, a relatively coarse thin film may be formed and side reactions may be suppressed. In addition, by controlling the thin film growth rate, process by-products within the thin film may be reduced, thereby reducing corrosion and deterioration. In addition, the crystallinity of the thin film may be improved, and a stoichiometric oxidation state may be reached when a metal oxide film is formed. In addition, even when a thin film is formed on a substrate having a complex structure, step coverage and the thickness uniformity of a thin film may be greatly improved.

As a specific example, the reaction surface pretreatment agent includes a compound having a structure containing nitrogen (N), oxygen (O), phosphorus (P), or sulfur (S) at each terminal of a central carbon atom connected by a double bond to oxygen. Thus, the effect of reducing process by-products and the effect of improving thin film density may be increased, and step coverage and the electrical properties of the thin film may be excellent.

Here, unless otherwise specified, the structure containing nitrogen (N), oxygen (O), phosphorus (P), or sulfur(S) at each terminal of a central carbon atom connected by a double bond to oxygen refers to

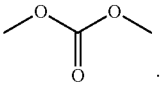

As a specific example, the reaction surface pretreatment agent includes a structure containing nitrogen (N), oxygen (O), phosphorus (P), or sulfur(S) at one end of a central carbon atom connected by a double bond to oxygen and carbon (C) at the other end. Thus, the effect of reducing process by-products and the effect of improving thin film density may be increased, and step coverage and the electrical properties of the thin film may be excellent.

Here, unless otherwise specified, the structure containing nitrogen (N), oxygen (O), phosphorus (P), or sulfur(S) at one end of a central carbon atom connected by a double bond to oxygen and carbon (C) at the other end refers to

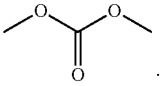

As a specific example, the reaction surface pretreatment agent may include one or more selected from compounds represented by Chemical Formulas 1 to 4 below. In this case, by forming a shielded area that does not remain in a thin film during thin film formation, a relatively coarse thin film may be formed and side reactions may be suppressed. In addition, by controlling the thin film growth rate, process by-products within the thin film may be reduced, thereby reducing corrosion and deterioration. In addition, the crystallinity of a thin film may be improved. In addition, even when a thin film is formed on a substrate having a complex structure, step coverage and the thickness uniformity of a thin film may be greatly improved.

[Chemical Formula 1]

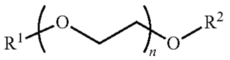

[Chemical Formula 2]

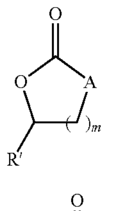

[Chemical Formula 3]

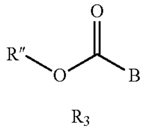

[Chemical Formula 4]

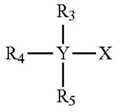

In Chemical Formulas 1 to 4, R1 and R2 are independently H or an alkyl group having 1 to 5 carbon atoms; R3, R4, and R5 are independently H or -(Me)z-$CH_3$, wherein Me is a saturated or unsaturated hydrocarbon with 1 to 3 carbon atoms, and z is an integer from 0 to 4; R' and R" are independently hydrogen, an alkyl group having 1 to 5 carbon atoms, an alkene group having 1 to 5 carbon atoms, or an alkoxy group having 1 to 5 carbon atoms;

A is oxygen (O), sulfur(S), phosphorus (P), nitrogen (N), —CH, or —$CH_2$;

B is —OH, —$OCH_3$, —$OCH_2CH_3$, —$CH_2CH_3$, —SH, —$SCH_3$, or —$SCH_2CH_3$;

X is fluorine (F), chlorine (Cl), bromine (Br), or iodine (I);

Y is carbon (C) or silicon (Si);

n is an integer from 1 to 4; and m is an integer from 0 to 3.

In Chemical Formula 1, R1 and R2 are an alkyl group having 1 to 5 carbon atoms, preferably an alkyl group having 2 to 4 carbon atoms. In this case, the effect of reducing process by-products and the effect of improving thin film density may be increased, and step coverage and the electrical properties, insulating properties, and dielectric properties of the thin film may be excellent.

In Chemical Formula 1, n is an integer from 2 to 4, preferably from 3 to 4. In this case, the effect of reducing process by-products and the effect of improving thin film density may be increased, and step coverage and the electrical properties, insulating properties, and dielectric properties of the thin film may be excellent.

In Chemical Formula 2, A is oxygen (O) or sulfur(S), preferably oxygen (O). In this case, the effect of reducing process by-products and the effect of improving thin film density may be increased, and step coverage and the electrical properties, insulating properties, and dielectric properties of the thin film may be excellent.

R' is an alkyl group having 1 to 3 carbon atoms, preferably an alkyl group having 1 to 2 carbon atoms. In this case, the effect of reducing process by-products and the effect of improving thin film density may be increased, and properties, insulating step coverage and the electrical properties, and dielectric properties of the thin film may be excellent.

m is an integer from 1 to 2, preferably an integer of 1.

In Chemical Formula 3, B is —OH, —$OCH_3$, —$OCH_2CH_3$, —$CH_2CH_3$, —SH, —$SCH_3$, or —$SCH_2CH_3$. In this case, the effect of reducing process by-products may be increased, step coverage may be excellent, and the effect of improving the density and electrical properties of a thin film may be excellent.

R" is an alkyl group having 1 to 3 carbon atoms, preferably an alkyl group having 1 to 2 carbon atoms. In this case, the effect of reducing process by-products may be increased, step coverage may be excellent, and the effect of improving the density and electrical properties of a thin film may be excellent.

In Chemical Formula 4, Y is carbon (C) or silicon (Si). In this case, the effect of reducing process by-products may be increased, step coverage may be excellent, and the effect of improving the density and electrical properties of a thin film may be excellent.

In Chemical Formula 4, X is chlorine (Cl), bromine (Br), or iodine (I), preferably bromine (Br) or iodine (I). In this case, the effect of reducing process by-products may be increased, step coverage may be excellent, and the effect of improving the density and electrical properties of a thin film may be excellent.

In Chemical Formula 4, R3, R4, and R5 are -(Me) z-$CH_3$. Here, Me is a saturated or unsaturated hydrocarbon with 1 to 3 carbon atoms, and z is an integer from 0 to 4, preferably an integer from 0 to 2. In this case, the effect of reducing process by-products and the effect of improving thin film density may be increased, and step coverage and the electrical properties, insulating properties, and dielectric properties of the thin film may be excellent.

For example, when the reaction surface pretreatment agent is a compound represented by Chemical Formula 1, the reaction surface pretreatment agent may be a compound having a refractive index of 1.4 to 1.42 or 1.43 to 1.5, as a specific example, 1.41 to 1.417 or 1.43 to 1.47, preferably 1.413 to 1.417 or 1.450 to 1.452.

For example, when the reaction surface pretreatment agent is a compound represented by Chemical Formula 2, the reaction surface pretreatment agent may be a compound having a refractive index of 1.39 or less, as a specific example, 1.3 to 1.39, preferably 1.35 to 1.385.

The reaction surface pretreatment agent may include one or more selected from compounds represented by Chemical Formulas 1-1 to 1-6, Chemical Formulas 2-1 to 2-4, Chemical Formulas 3-1 to 3-4, and Chemical Formulas 4-1 to 4-4 below. In this case, by providing a thin film-shielded area, the growth rate of a thin film may be effectively controlled, and process by-products may be effectively removed. In addition, step coverage and film quality may be greatly improved.

[Chemical Formulas 1-1 to 1-6]

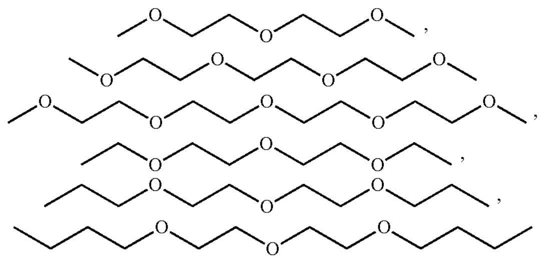

[Chemical Formulas 2-1 to 2-4]

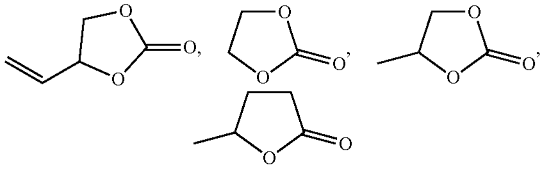

[Chemical Formulas 3-1 to 3-4]

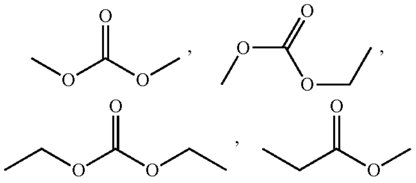

[Chemical Formulas 4-1 to 4-4]

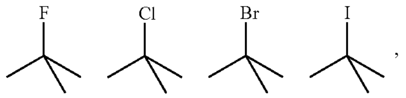

The reaction surface pretreatment agent is characterized by not remaining on the thin film.

At this time, unless otherwise specified, non-residue refers to a case where the content of C element is less than 0.1 atom %, the content of Si element is less than 0.1 atom %, the content of N element is less than 0.1 atom %, and the content of halogen element is less than 0.1 atom % when analyzed by XPS. More preferably, in the secondary-ion mass spectrometry (SIMS) measurement method or X-ray photoelectron spectroscopy (XPS) measurement method, in which measurements are performed in the depth direction of a substrate, considering the increase/decrease rates of C, N, Si, and halogen impurities before and after using an activator under the same deposition conditions, it is desirable that the increase/decrease rate of the signal sensitivity (intensity) of each element type does not exceed 5%.

The ligand substitution agent of the present invention may provide a sufficient adsorption area on a substrate by reducing the activation energy of a precursor compound adsorbed on the substrate and effectively replacing a ligand in the precursor compound. That is, it is desirable to use a compound capable of replacing the ligand of the precursor compound adsorbed on the substrate.

For example, substitution of the ligand may be accomplished on the entire substrate or a portion of the substrate on which a thin film is formed using the reaction surface pretreatment agent and the precursor compound.

For example, when a total area of the substrate is 100%, an area where a thin film is formed (hereinafter referred to as 'shielded area') may occupy 10 to 95%, as a specific example, 15 to 90%, preferably 20 to 85%, more preferably 30 to 80%, still more preferably 40 to 75%, still more preferably 40 to 70% of a total area of the entire substrate or a portion of the substrate on which the thin film is formed, and an unshielded area may occupy the remaining area.

When a total area of the substrate is 100%, a first shielded area may occupy 10 to 95%, as a specific example, to 90%, preferably 20 to 85%, more preferably 30 to 80%, still more preferably 40 to 75%, still more preferably 40 to 70% of a total area of the entire substrate or a portion of the substrate, a second shielded area may occupy 10 to 95%, as a specific example, 15 to 90%, preferably 20 to 85%, more preferably 30 to 80%, still more preferably 40 to 75%, still more preferably 40 to 70% of the remaining area, and an unshielded area may occupy the remaining area.

The ligand substitution agent may include one or more selected from hydrogen iodide, hydrogen iodide water, methyl iodide, ethyl iodide, propyl iodide, butyl iodide, isopropyl iodide, and tert-butyl iodide. In this case, by suppressing side reactions during thin film formation and controlling the thin film growth rate, process by-products within the thin film may be reduced, thereby reducing corrosion and deterioration. In addition, film quality including thin film crystallinity may be improved, and a stoichiometric oxidation state may be reached when a metal oxide film is formed. In addition, even when a thin film is formed on a substrate having a complex structure, step coverage and the thickness uniformity of a thin film may be greatly improved.

As a specific example, the ligand substitution agent is a 3 N to 15 N hydrogen iodide single substance, a gas mixture containing 1 to 99% by weight of 3 N to 15 N hydrogen iodide and an inert gas filling up to 100% by weight of a total weight, or an aqueous solution mixture containing 0.5 to 70% by weight of 3N to 15N hydrogen iodide and water filling up to 100% by weight of a total weight. Here, when the inert gas is nitrogen, helium, or argon with a purity of 4 N to 9 N, the effect of reducing process by-products and the effect of improving thin film density may be increased, and step coverage and the electrical properties of the thin film may be excellent.

Preferably, the ligand substitution agent is a 5 N to 6 N hydrogen iodide single substance, a gas mixture containing 1 to 99% by weight of 5 N to 6 N hydrogen iodide and an inert gas filling up to 100% by weight of a total weight, or an aqueous solution mixture containing 0.5 to 70% by weight of 5 N to 6 N hydrogen iodide and water filling up to 100% by weight of a total weight. Here, the inert gas may be nitrogen, helium, or argon with a purity of 4 N to 9 N. In this case, by suppressing side reactions during thin film formation and controlling the thin film growth rate, process by-products within the thin film may be reduced, thereby reducing corrosion and deterioration. In addition, film quality including thin film crystallinity may be improved. In addition, even when a thin film is formed on a substrate having a complex structure, step coverage and the thickness uniformity of a thin film may be greatly improved.

The ligand substitution agent is preferably a 5 N to 6 N hydrogen iodide single substance, a gas mixture containing 1 to 99% by weight of 5 N to 6 N hydrogen iodide and an inert gas filling up to 100% by weight of a total weight, or an aqueous solution mixture containing 0.5 to 70% by weight of 5 N to 6 N hydrogen iodide and water filling up to 100% by weight of a total weight. Here, the inert gas may be nitrogen, helium, or argon with a purity of 4 N to 9 N.

For example, when the ligand substitution agent is a hydrogen iodide compound, the ligand substitution agent may be a compound having a refractive index of 1.4 to 1.42 or 1.43 to 1.5, as a specific example, 1.41 to 1.417 or 1.43 to 1.47, preferably 1.413 to 1.417 or 1.450 to 1.452.

In this case, by reducing the activation energy required for the ligand substitution reaction of the activator having the above-described structure on a substrate, by appropriately shielding the adsorption of the precursor compound on the substrate, the reaction speed may be improved.

In addition, even when forming a thin film on a substrate with a complex structure, step coverage and the thickness uniformity of a thin film may be greatly improved. In addition to a thin film precursor, the surface of the substrate may be effectively protected by preventing the adsorption of process by-products, and process by-products may be effectively removed.

The reaction surface pretreatment agent or ligand substitution agent may be preferably a compound having a purity of 99.9% or more, 99.95% or more, or 99.99% or more. For reference, when a compound having a purity of less than 99% is used, impurities may remain in a thin film or cause side reactions with precursors or reactants. Accordingly, it is desirable to use a material having a purity of 99% or more.

The reaction surface pretreatment agent and the ligand substitution agent are preferably used in the atomic layer deposition (ALD) process. In this case, the surface of a substrate may be effectively protected and process by-products may be effectively removed without interfering with the adsorption of a precursor compound.

The reaction surface pretreatment agent and the ligand substitution agent may preferably have a density of 0.8 to 3.0 $g/cm^3$, 0.8 to 2.9 $g/cm^3$, 1.8 to 2.9 $g/cm^3$, or 0.8 to 1.8 $g/cm^3$. Within this range, a substitution area may be effectively formed, and step coverage, the thickness uniformity of a thin film, and film quality may be improved.

For example, the thin film may include a halogen compound in an amount of 100 ppm or less. For reference, when excess halogen remains, it is not desirable because chlorides, such as NH4Cl, may be generated and may remain in the thin film when using a nitriding agent under the experimental conditions of 200 to 300° C. described later.

The thin film may be used as an etching stop film, an electrode film, a dielectric film, a gate insulating film, a block oxide film, or a charge trap, without being limited thereto.

In particular, as a relatively coarse thin film is formed, the growth rate of a thin film formed at the same time is greatly reduced, so that even when applied to a substrate having a complex structure, the uniformity of the thin film may be secured, and the step coverage may be greatly improved. In particular, deposition in a thin thickness is possible, and the remaining amounts of O, Si, metals, and metal oxides remaining as process by-products may be improved. In addition, even the remaining amount of carbon, which was difficult to reduce in the past, may be improved.

The method of forming a thin film according to one embodiment of the present invention may include a step of partially shielding a reaction site where the precursor compound is adsorbed on the surface of the loaded substrate by injecting the above-described reaction surface pretreatment agent into the chamber. In this case, by effectively replacing the adsorption of the precursor adsorbed on the substrate, the reaction speed may be improved and the thin film growth rate may be appropriately reduced. In addition, even when forming a thin film on a substrate with a complex structure, step coverage and thin film uniformity may be significantly improved.

In the step of shielding the reaction surface pretreatment agent on the substrate surface, the feeding time (sec) of the reaction surface pretreatment agent on the substrate surface is preferably 0.01 to 10 seconds, more preferably 0.02 to 8 seconds, still more preferably 0.04 to 6 seconds, still more preferably 0.05 to 4 seconds per cycle. Within this range, thin film growth rate may be reduced, and step coverage and economics may be excellent.

In the present disclosure, the feeding time of the reaction surface pretreatment agent is based on a flow rate of 0.1 to 50 mg/cycle at a chamber volume of 15 to 20 L, more specifically, based on a flow rate of 0.8 to 20 mg/cycle with a chamber volume of 18 L.

The method of forming a thin film according to another embodiment of the present invention may include a step of injecting the ligand substitution agent into the chamber to replace the ligand of the precursor compound adsorbed on the surface of the loaded substrate. In this case, by effectively replacing the ligand of the precursor adsorbed on the substrate, the reaction speed may be improved and the thin film growth rate may be appropriately reduced. In addition, even when forming a thin film on a substrate with a complex structure, film quality such as electrical properties, dielectric properties, and thin film density may be greatly improved.

In the present disclosure, the feeding time of the ligand substitution agent is based on a flow rate of 0.1 to 8,000 mg/cycle at a chamber volume of 15 to 20 L, more specifically based on a flow rate of 10 to 5,000 mg/cycle at a chamber volume of 18 L.

As a preferred example, the method of forming a thin film may include step i) of vaporizing the above-described reaction surface pretreatment agent to shield the surface of the substrate loaded in the chamber; step ii) of performing 1st purging inside the chamber with a purge gas; step iii) of vaporizing a precursor compound and adsorbing the precursor compound onto an area outside the shielded area; step iv) of performing 2nd purging inside the chamber with a purge gas; step v) of activating the adsorbed region by vaporizing the above-described ligand substitution agent; step vi) of performing 3rd purging inside the chamber with a purge gas; step vii) of supplying a reaction gas inside the chamber; and step viii) of performing 4th purging the inside of the chamber with a purge gas. At this time, steps i) to viii) may be repeated as a unit cycle until a thin film of the desired thickness is obtained (see FIG. 1 below). In this way, in one cycle, when the reaction surface pretreatment agent is injected before the precursor compound and is absorbed into the substrate, and the ligand substitution agent is sequentially injected after the precursor compound to improve film quality, even when deposited at high temperatures, the thin film growth rate may be appropriately reduced, the generated process by-products may be effectively removed, the resistivity of the thin film may be reduced, the step coverage may be greatly improved, the thin film uniformity may be improved, and the film quality such as electrical properties, dielectric properties, and thin film density may be improved.

As a preferred example, in the method of forming a thin film according to the present invention, in one cycle, the reaction surface pretreatment agent of the present invention may be introduced before the precursor compound and adsorbed onto the substrate, and the ligand substitution agent may be added after the precursor compound to replace the ligand of the precursor. In this case, even when depositing a thin film at high temperatures, process by-products may be significantly reduced and step coverage may be significantly improved by appropriately reducing the thin film growth rate. In addition, the crystallinity of the thin film may be increased, thereby reducing the resistivity of the thin film. In addition, even when applied to semiconductor devices with a large aspect ratio, the thickness uniformity of the thin film may be greatly improved, thereby ensuring the reliability of the semiconductor device. In addition, film quality including electrical properties, dielectric properties, and thin film density may be improved.

For example, in the method of forming a thin film, when the reaction surface pretreatment agent is deposited before or after the deposition of the precursor compound, depending on the needs, the unit cycle may be repeated 1 to 99, 999 times, preferably 10 to 10,000 times, more preferably 50 to 5,000 times, still more preferably 100 to 2,000 times. Within this range, the desired thickness of the thin film may be obtained, and the effects intended for the present invention may be sufficiently achieved.

For example, the chamber may be an ALD chamber, a CVD chamber, a PEALD chamber, or a PECVD chamber.

The reaction surface pretreatment agent, ligand substitution agent, or precursor compound may be vaporized, injected, and then subjected to plasma post-treatment. In this case, the growth rate of thin film may be improved and process by-products may be reduced.

When the reaction surface pretreatment agent and the ligand substitution agent are sequentially injected onto the substrate and the precursor compound is adsorbed therebetween, in the step of purging the unadsorbed reaction surface pretreatment agent and the unadsorbed ligand substitution agent, the amount of purge gas injected into the chamber is not particularly limited as long as the amount is sufficient to remove the unadsorbed reaction surface pretreatment agent and the unadsorbed ligand substitution agent. For example, the amount of purge gas may be 10 to 100,000 times, preferably 50 to 50,000 times, more preferably 100 to 10,000 times. Within this range, by sufficiently removing the unadsorbed reaction surface pretreatment agent and the unadsorbed ligand substitution agent, a thin film may be formed evenly and deterioration of film quality may be prevented. Here, the input amounts of the purge gas, reaction surface pretreatment agent, and ligand substitution agent are each based on one cycle, and the volume of the reaction surface pretreatment agent and the ligand substitution agent refers to the volume of the vaporized reaction surface pretreatment agent and the vaporized ligand substitution agent.

As a specific example, in the step of injecting the reaction surface pretreatment agent and the ligand substitution agent at a flow rate 100 mL/cycle (injection time 1 sec), and purging the unadsorbed reaction surface pretreatment agent and the unadsorbed ligand substitution agent, when the purge gas is injected at a flow rate 3000 mL/min (injection time 10 sec), the injection amount of the purge gas is 300 times the injection amount of the reaction surface pretreatment agent and the ligand substitution agent.

In addition, in the step of purging the unadsorbed precursor compound, the amount of purge gas injected into the chamber is not particularly limited as long as the amount is sufficient to remove the unadsorbed precursor compound. For example, the amount may be 10 to 10,000 times, preferably 50 to 50,000 times, more preferably 100 to 10,000 times the volume of the precursor compound injected into the chamber. Within this range, by sufficiently removing the unadsorbed precursor compound, a thin film may be formed evenly and deterioration of film quality may be prevented. Here, the input amounts of the purge gas and precursor compound are each based on one cycle, and the volume of the precursor compound refers to the volume of the vaporized precursor compound vapor.

In addition, in the purging step performed immediately after the reaction gas supply step, the amount of purge gas introduced into the chamber may be, for example, 10 to 10,000 times, preferably 50 to 50,000 times, more preferably 100 to 10,000 times the volume of reaction gas introduced into the chamber. Within this range, the desired effects may be sufficiently achieved. Here, the input amounts of purge gas and reaction gas are based on one cycle.

The reaction surface pretreatment agent, the ligand substitution agent, and the precursor compound may be transported into the chamber preferably by a VFC, DLI, or LDS method, more preferably an LDS method.

For example, the substrate loaded into the chamber may be heated to 50 to 400° C., as a specific example, 50 to 400° C. The reaction surface pretreatment agent, the ligand substitution agent, or the precursor compound may be injected onto the substrate in an unheated or heated state, or may be injected unheated and then heated during the deposition process, depending on the deposition efficiency. For example, the reaction surface pretreatment agent, the ligand substitution agent, or the precursor compound may be injected onto the substrate at 50 to 400° C. for 1 to 20 seconds.

The ratio of amount (mg/cycle) of the reaction surface pretreatment agent and the precursor compound fed into the chamber may be preferably 1:1.5 to 1:20, more preferably 1:2 to 1:15, still more preferably 1:2 to 1:12, still more preferably 1:2.5 to 1:10. Within this range, step coverage may be improved, and process by-products may be greatly reduced.

For example, the method of forming a thin film may be performed at a deposition temperature of 50 to 800° C., preferably 100 to 700° C., more preferably 200 to 650° C., still more preferably 220 to 400° C., still more preferably 220 to 300° C. Within this range, a thin film with excellent film quality may be grown while implementing ALD process characteristics.

For example, the method of forming a thin film may be performed at a deposition pressure of 0.01 to 20 Torr, preferably 0.1 to 20 Torr, more preferably 0.1 to 10 Torr, most preferably 0.3 to 7 Torr. Within this range, a thin film having a uniform thickness may be obtained.

In the present disclosure, the deposition temperature and the deposition pressure may be measured as temperature and pressure formed within the deposition chamber, as temperature and pressure applied to the substrate within the deposition chamber.

The method of forming a thin film may preferably include a step of increasing temperature inside the chamber to deposition temperature before introducing the reaction surface pretreatment agent into the chamber; and/or a step of purging by injecting an inert gas into the chamber before introducing the reaction surface pretreatment agent into the chamber.

In the method of forming a thin film, the residual halogen intensity (c/s) in the thin film may be preferably 100,000 or less, more preferably 70,000 or less, still more preferably 50,000 or less, still more preferably 10,000 or less, as a preferred example, 5,000 or less, still more preferably 1,000 to 4,000, still more preferably 1,000 to 3,800 as measured using a thin film having a thickness of 100 Å according to SIMS. Within this range, corrosion and deterioration may be effectively prevented.

In the present disclosure, purging may be performed at preferably 1,000 to 50,000 sccm (standard cubic centimeter per minute), more preferably 2,000 to 30,000 sccm, still more preferably 2,500 to 15,000 sccm. Within this range, the thin film growth rate per cycle may be appropriately controlled. In addition, since deposition is performed as an atomic mono-layer or nearly an atomic mono-layer, the film quality may be improved.

In addition, as a thin film manufacturing device capable of implementing the thin film manufacturing method, the present invention may include a thin film manufacturing device including an ALD chamber, a first vaporizer for vaporizing a reaction surface pretreatment agent, a first transport means for transporting the vaporized reaction surface pretreatment agent into the ALD chamber, a second vaporizer for vaporizing the precursor compound, a second transport means for transporting the vaporized precursor compound into the ALD chamber, a third vaporizer for vaporizing the ligand substitution agent, and a third transport means for transporting the vaporized ligand substitution agent into the ALD chamber. Here, vaporizers and transport means commonly used in the technical field to which the present invention pertains may be used in the present invention without particular limitation.

When necessary, the first vaporizer for vaporizing a reaction surface pretreatment agent may be composed of at least two types: a vaporizer for vaporizing a reaction surface pretreatment agent and a vaporizer for vaporizing a ligand substitution agent.

As a specific example, the method of forming a thin film is explained. First, a substrate on which a thin film is to be formed is placed in a deposition chamber capable of atomic layer deposition.

The substrate may include a semiconductor substrate, such as a silicon substrate or a silicon oxide substrate.

The substrate may further have a conductive layer or an insulating layer formed on the upper portion thereof.

To deposit a thin film on the substrate positioned in the deposition chamber, the above-described reaction surface pretreatment agent, a precursor compound, or a mixture of the precursor compound and a non-polar solvent is prepared.

Then, the prepared reaction surface pretreatment agent is injected to a vaporizer, is transformed into a vapor phase, is transferred into a deposition chamber, and is adsorbed on a substrate. Then, purging is performed to remove the unadsorbed reaction surface pretreatment agent.

Next, the prepared precursor compound or a mixture of the precursor compound and a non-polar solvent (hereinafter referred to as composition for forming a thin film) is injected into the vaporizer, is transformed into a vapor phase, is transferred into the deposition chamber, and is adsorbed on the substrate. Then, shielding is performed by a preinjected reaction surface pretreatment agent, and the unadsorbed precursor compound or mixture of the precursor compound and a non-polar solvent is purged.

The non-polar solvent may preferably include one or more selected from the group consisting of alkanes and cycloalkanes. In this case, an organic solvent with low reactivity and solubility and easy moisture management may be included. In addition, step coverage may be improved even when deposition temperature increases during thin film formation.

As a more desirable example, the non-polar solvent may include a C1 to C10 alkane or a C3 to C10 cycloalkane, preferably a C3 to C10 cycloalkane. In this case, reactivity and solubility may be low and moisture management may be easy.

In the present disclosure, C1, C3, and the like indicate the number of carbon atoms.

The cycloalkane may preferably include C3 to C10 monocycloalkanes, and among the monocycloalkanes, cyclopentane is liquid at room temperature and has the highest vapor pressure, so cyclopentane is preferable in the vapor deposition process, but the present invention is not limited thereto.

For example, the non-polar solvent may have a solubility (25° C.) of 200 mg/L or less, preferably 50 to 400 mg/L, more preferably 135 to 175 mg/L in water. Within this range, the reactivity toward the precursor compound may be reduced, and moisture may be easily managed.

In the present disclosure, solubility may be measured without any particular limitation by a measurement method or standard commonly used in the technical field to which the present invention pertains. For example, solubility may be measured by the HPLC method using a saturated solution.

Based on a total weight of the precursor compound and the non-polar solvent, the non-polar solvent may be included in an amount of 5 to 95% by weight, more preferably 10 to 90% by weight, still more preferably 40 to 90% by weight, most preferably 70 to 90% by weight.

When the content of the non-polar solvent exceeds the above range, impurities may be generated, which may increase the resistance and impurities within a thin film. When the content of the organic solvent is less than the range, the effect of improving step coverage due to solvent addition and the effect of reducing impurities such as chloride (Cl) ions may be reduced.

Next, the prepared ligand d substitution agent is injected into the vaporizer, is transformed into a vapor phase, is transferred into the deposition chamber, and is adsorbed. Then, the unadsorbed ligand substitution agent is purged.

In the present disclosure, for example, the reaction surface pretreatment agent, the ligand substitution agent, and the precursor compound (composition for forming a thin film) may be delivered into the deposition chamber by vapor flow control (VFC) using 1 mass flow control (MFC) or a liquid delivery system (LDS) using liquid mass flow control (LMFC), preferably an LDS method.

At this time, a mixed gas of one or more selected from the group consisting of argon (Ar), nitrogen ($N_2$), and helium (He) may be used as a carrier gas or dilution gas to move the reaction surface pretreatment agent, the ligand substitution agent, and the precursor compound onto the substrate, without being limited thereto.

In the present disclosure, for example, an inert gas, preferably the carrier gas or dilution gas may be used as the purge gas.

Next, a reaction gas is supplied. A reaction gas commonly used in the technical field to which the present invention pertains may be used in the present invention without particular limitation. Preferably, the reaction gas may contain a nitriding agent. The nitriding agent and the precursor compound adsorbed on the substrate react to form a nitride film.

Preferably, the nitriding agent may be nitrogen gas ($N_2$), hydrazine gas ($N_2H_4$), or a mixture of nitrogen gas and hydrogen gas.

Next, unreacted residual reaction gas is purged using an inert gas. Accordingly, in addition to excess reaction gas, generated byproducts may also be removed.

As described above, in the method of forming a thin film, for example, a step of supplying a reaction surface pretreatment agent onto a substrate, a step of purging the unadsorbed reaction surface pretreatment agent, a step of adsorbing a precursor compound/composition for forming a thin film on the substrate, a step of purging the unadsorbed precursor compound, a step of adsorbing the ligand substitution agent onto the substrate, a step of purging the unadsorbed ligand substitution agent, a step of supplying a reaction gas, and a step of purging the residual reaction gas may be set as a unit cycle. To form a thin film of desired thickness, the unit cycle may be repeated.

For example, the unit cycle may be repeated 1 to 99, 999 times, preferably 10 to 1,000 times, more preferably 50 to 5,000 times, still more preferably 100 to 2,000 times. Within this range, the desired thin film properties may be well expressed.

In addition, the present invention provides a semiconductor substrate, and the semiconductor substrate is fabricated by the thin film formation method. In this case, the step coverage and thickness uniformity of a thin film may be excellent, and density and electrical properties may be excellent.

The manufactured thin film may preferably have a thickness of 20 nm or less, a resistivity value of 50 to 400 μΩ·cm based on a thin film thickness of 10 nm, a halogen content of 10,000 ppm or less, and a step coverage of 90% or more. Within this range, the thin film has excellent performance as a diffusion barrier and has the effect of reducing corrosion of metal wiring materials, without being limited thereto.

For example, the thin film may have a thickness of 0.1 to 20 nm, preferably 1 to 20 nm, more preferably 3 to 25 nm, still more preferably 5 to 20 nm. Within this range, thin film properties may be excellent.

For example, based on a thin film thickness of 10 nm, the thin film may have a resistivity value of 0.1 to 400 μΩ·cm, preferably 15 to 300 μΩ·cm, more preferably 20 to 290 μΩ·cm, still more preferably 25 to 280 μΩ·cm. Within this range, thin film properties may be excellent.

The thin film may have a halogen content of preferably 10,000 ppm or less or 1 to 9,000 ppm, still more preferably 5 to 8,500 ppm, still more preferably 100 to 1,000 ppm. Within this range, thin film properties may be excellent, and thin film growth rate may be reduced. Here, the halogen remaining in the thin film may be, for example, $Cl_2$, Cl, or $Cl^-$. As the halogen residue within the thin film decreases, the film quality increases.

For example, the thin film may have a step coverage of 90% or more, preferably 92% or more, more preferably 95% or more. Within this range, since even a thin film of complex structure may be easily deposited on a substrate, the thin film may be applied to next-generation semiconductor devices.

The manufactured thin film may preferably have a thickness of 20 nm or less, a carbon, nitrogen, and halogen content of 10,000 ppm or less based on a thin film thickness of 10 nm, and a step coverage of 90% or more. Within this range, the thin film may have excellent performance as a dielectric film or blocking film, without being limited thereto.

For example, when necessary, the thin film may have a multilayer structure of two or three layers. As a specific example, the multilayer film with a two-layer structure may have a lower layer-middle layer structure, and the multilayer film with a three-layer structure may have a lower layer-middle layer-upper layer structure.

For example, the lower layer may be formed of one or more selected from the group consisting of Si, $SiO_2$, MgO, $Al_2O_3$, CaO, $ZrSiO_4$, $ZrO_2$, $HfSiO_4$, $Y_2O_3$, $HfO_2$, $LaLuO_2$, $Si_3N_4$, SrO, $La_2O_3$, $Ta_2O_5$, BaO, and $TiO_2$.

For example, the middle layer may be formed of $Ti_xN_y$, preferably TN.

For example, the upper layer may be formed of one or more selected from the group consisting of W and Mo.

Hereinafter, preferred examples and drawings are presented to help understand the present invention, but the following examples and drawings are only illustrative of the present invention, and it is obvious to those skilled in the art that various changes and modifications are possible within the scope and technical idea of the present invention. Such changes and modifications fall within the scope of the appended patent claims.

EXAMPLES

Example 1, Comparative Examples 1 to 3

An ALD deposition process was performed according to FIG. 1 below using the components shown in Table 1 below.

FIG. 1 below is a schematic diagram showing a deposition process sequence according to the present invention, focusing on one cycle.

Specifically, as the reaction surface pretreatment agent, a compound represented by Chemical Formula 3-1 below was prepared, and as the ligand substitution agent, a 5 N compound represented by Chemical Formula 7 below was prepared. In addition, as the precursor, $TiCl_4$ was prepared.

[Chemical Formula 3-1]

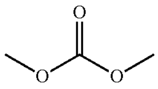

[Chemical Formula 7]

H—I

As shown in FIG. 1 below, the prepared reaction surface pretreatment agent was placed in a canister and supplied to a vaporizer heated to 150° C. at a flow rate of 0.1 g/min using a liquid mass flow controller (LMFC) at room temperature. Then, the reaction surface pretreatment agent vaporized in a vapor phase in the vaporizer was injected into the deposition chamber loaded with the substrate for 2 seconds, and then argon gas was supplied at 5000 sccm for 10 seconds to perform argon purging. At this time, the pressure inside the reaction chamber was controlled to 2.5 Torr.

Next, the prepared precursor compound was placed in a separate canister and supplied to a separate vaporizer heated to 150° C. at a flow rate of 0.1 g/min using a liquid mass flow controller (LMFC) at room temperature. Then, $TiCl_4$ vaporized in a vapor phase in the vaporizer was injected into the deposition chamber for 2 seconds, and then argon gas was supplied at 5000 sccm for 10 seconds to perform argon purging. At this time, the pressure inside the reaction chamber was controlled to 2.5 Torr.

Next, the prepared ligand substitution agent was placed in a canister and supplied to the chamber at a flow rate of 100 mL/min using a mass flow controller (MFC) at room temperature. Then, the ligand substitution agent vaporized in a vapor phase in the vaporizer was injected into the deposition chamber loaded with the substrate for 2 seconds, and then argon gas was supplied at 5000 sccm for 10 seconds to perform argon purging. At this time, the pressure inside the reaction chamber was controlled to 2.5 Torr.

Next, 1000 sccm of ammonia as a reactive gas was injected into the reaction chamber for 2 seconds, followed by argon purging for 10 seconds. At this time, the substrate on which a metal thin film was to be formed was heated to 100° C.

By repeating this process 200 to 400 times, a self-limiting atomic layer thin film with a thickness of 10 nm was formed.

For each thin film of Example 1 and Comparative Examples 1 to 3 obtained, the deposition rate (D/R) and SIMS C impurities were measured in the following manner, and the results are shown in Table 1 below and FIG. 2 below.

Specifically, using an ellipsometer which is a device capable of measuring optical properties such as thickness and refractive index of the thin film by using the polarization characteristics of light for the manufactured thin film, the thickness of the thin film deposited per cycle was calculated by dividing the measured thickness of the thin film by the number of cycles.

The deposition rate (D/R) shown in Table 1 below is the value measured at room temperature and pressure using an ellipsometer for thin films with a thickness of 3 to 30 nm, and is expressed in a unit of Å/cycle.

* SIMS (Secondary-ion mass spectrometry) C impurities: The C impurity value was checked from the SIMS graph by considering the C impurity content (counts) when the thin film was axially penetrated by an ion sputter and the sputter time was 50 seconds with little contamination on the substrate surface layer.

As shown in Table 1 and FIG. 2 below, compared to Comparative Example 1 in which the reaction surface pretreatment agent and ligand substitution agent of the present invention were not used, in Example 1 in which the reaction surface pretreatment agent and the ligand substitution agent were used, deposition rate was significantly improved, and impurity reduction characteristics was excellent. However, compared to Comparative Example 2 in which the ligand substitution agent of the present invention was not used, in Example 1 using the reaction surface pretreatment agent and ligand substitution agent of the present invention, no improvement in deposition rate was observed. However, compared to Comparative Example 3 in which the reaction surface pretreatment agent was not used, in Example 1, deposition rate was greatly improved, and impurity reduction characteristics was excellent.

Therefore, by sequentially applying the reaction surface pretreatment agent, the ligand substitution agent, and the precursor compound according to the present invention, even when forming a thin film on a substrate with a complex structure, the thickness uniformity of a thin film was greatly improved, impurities were significantly reduced, film quality was improved. Thus, it was confirmed that thin films with improved step coverage and film quality may be applied to semiconductor devices.

The invention claimed is:

1. A method of forming a thin film, comprising:

injecting a reaction surface pretreatment agent into a chamber to shield a surface of a loaded substrate;

injecting a precursor compound into the chamber and adsorbing the precursor compound onto the surface of the shielded substrate;

injecting a ligand substitution agent into the chamber to perform ligand substitution of the adsorbed precursor compound; and injecting a reaction gas into the chamber to form a thin film, wherein the reaction surface pretreatment agent comprises one or more selected from compounds represented by Chemical Formulas 1 to 4 below; and

TABLE 1

| | Step | | | | | | | | |
|---|---|---|---|---|---|---|---|---|---|
| | 1 | 2 | 3 | 4 | 5 | 6 | 7 | 8 | Results |
| Process | Reaction surface pretreatment agent | Purge | precursor | Purge | Ligand substitution agent | Purge | Reactant | Purge | D/R [Å/cycle] |
| Material | DMC | Ar | TiCl4 | Ar | HI | Ar | NH3 | Ar | |
| Comparative Example1 | — | — | 2 seconds | 10 seconds | — | — | 5 seconds | 10 seconds | 0.35 |
| Comparative Example2 | 2 seconds | 10 seconds | 2 seconds | 10 seconds | — | — | 5 seconds | 10 seconds | 0.2 |
| Comparative Example3 | — | — | 2 seconds | 10 seconds | 2 seconds | 10 seconds | 5 seconds | 10 seconds | 0.5 |
| Example1 | 2 seconds | 10 seconds | 2 seconds | 10 seconds | 2 seconds | 10 seconds | 2 seconds | 10 seconds | 0.25 |

wherein the ligand substitution agent comprises one or more selected from hydrogen iodide, hydrogen iodide water, methyl iodide, ethyl iodide, propyl iodide, butyl iodide, isopropyl iodide, and tert-butyl iodide;

[Chemical Formula 1]

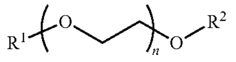

[Chemical Formula 2]

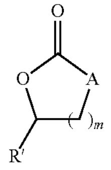

[Chemical Formula 3]

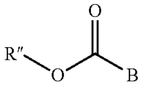

[Chemical Formula 4]

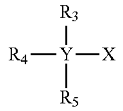

wherein, in Chemical Formulas 1 to 4, $R^1$ and $R^2$ are independently H or an alkyl group having 1 to 5 carbon atoms;

$R_3$, $R_4$, and $R_5$ are independently H or -(Me)z-$CH_3$, wherein Me is a saturated or unsaturated hydrocarbon with 1 to 3 carbon atoms, and z is an integer from 0 to 4;

R' and R" are independently hydrogen, an alkyl group having 1 to 5 carbon atoms, an alkene group having 1 to 5 carbon atoms, or an alkoxy group having 1 to 5 carbon atoms;

A is oxygen (O), sulfur(S), phosphorus (P), nitrogen (N),—CH, or —$CH_2$;

B is —OH, —$OCH_3$, —$OCH_2CH_3$, —$CH_2CH_3$, —SH, —$SCH_3$, or —$SCH_2CH_3$;

X is fluorine (F), chlorine (Cl), bromine (Br), or iodine (I);

Y is carbon (C) or silicon (Si);

n is an integer from 1 to 4; and m is an integer from 0 to 3.

2. The method according to claim 1, wherein the reaction surface pretreatment agent has two or more types of nitrogen (N), oxygen (O), phosphorus (P), and sulfur(S) and comprises a linear or cyclic saturated or unsaturated hydrocarbon having 3 to 15 carbon atoms.

3. The method according to claim 1, wherein the reaction surface pretreatment agent comprises a compound having a structure containing nitrogen (N), oxygen (O), phosphorus (P), or sulfur(S) at each terminal of a central carbon atom connected by a double bond to oxygen.

4. The method according to claim 1, wherein the reaction surface pretreatment agent comprises a compound having a structure containing nitrogen (N), oxygen (O), phosphorus (P), or sulfur(S) at one end of a central carbon atom connected by a double bond to oxygen and carbon (C) at the other end.

5. The method according to claim 1, wherein the reaction surface pretreatment agent comprises one or more selected from compounds represented by Chemical Formulas 1-1 to 1-6, Chemical Formulas 2-1 to 2-4, Chemical Formulas 3-1 to 3-4, and Chemical Formulas 4-1 to 4-4 below:

[Chemical Formulas 1-1 to 1-6]

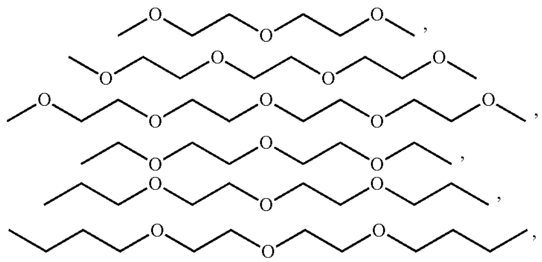

[Chemical Formulas 2-1 to 2-4]

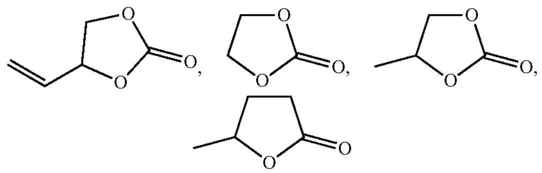

[Chemical Formulas 3-1 to 3-4]

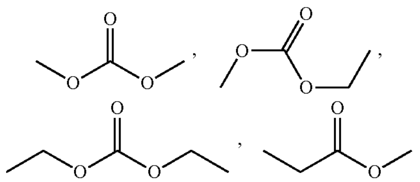

[Chemical Formulas 4-1 to 4-4]

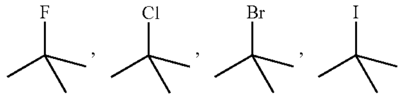

6. The method according to claim 1, wherein the ligand substitution agent is a 3 N to 15 N hydrogen iodide single substance, a gas mixture containing 1 to 99% by weight of 3 N to 15 N hydrogen iodide and an inert gas filling up to 100% by weight of a total weight, or an aqueous solution mixture containing 0.5 to 70% by weight of 3N to 15N hydrogen iodide and water filling up to 100% by weight of a total weight, wherein the inert gas is nitrogen, helium, or argon with a purity of 4 N to 9 N.

7. The method according to claim 1, wherein the thin film is a laminated film of one or more selected from the group consisting of Al, Si, Ti, V, Co, Ni, Cu, Zn, Ga, Ge, Se, Zr, Nb, Mo, Ru, Rh, In, Sn, Sb, Te, Hf, Ta, W, Re, Os, Ir, La, Ce, and Nd.

8. The method according to claim 1, wherein the thin film is formed on an entire or part of a substrate on which an oxide film, a nitride film, a metal film, or a selective thin film thereof is formed.

9. The method according to claim 1, wherein the chamber is an ALD chamber.

10. The method according to claim 1, wherein the reaction surface pretreatment agent, the precursor compound, or the ligand substitution agent is transferred into a chamber by a VFC (Vapor Flow Control), DLI (Direct Liquid Injection), or LDS (Liquid Delivery System) method, and the thin film is a silicon nitride film, a silicon oxide film, a titanium nitride film, a titanium oxide film, a tungsten nitride film, a molybdenum nitride film, a hafnium oxide film, a zirconium oxide film, a tungsten oxide film, or an aluminum oxide film.

* * * * *